US010120750B2

(12) United States Patent
Takeda et al.

(10) Patent No.: US 10,120,750 B2
(45) Date of Patent: Nov. 6, 2018

(54) CACHE MEMORY, ERROR CORRECTION CIRCUITRY, AND PROCESSOR SYSTEM

(71) Applicant: KABUSHIKI KAISHA TOSHIBA, Tokyo (JP)

(72) Inventors: Susumu Takeda, Kanagawa (JP); Hiroki Noguchi, Kanagawa (JP); Kazutaka Ikegami, Kanagawa (JP); Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 15/262,241

(22) Filed: Sep. 12, 2016

(65) Prior Publication Data

US 2016/0378593 A1    Dec. 29, 2016

Related U.S. Application Data

(63) Continuation of application No. PCT/JP2015/058069, filed on Mar. 18, 2015.

(30) Foreign Application Priority Data

Mar. 18, 2014    (JP) ................................ 2014-055343

(51) Int. Cl.
*G11C 29/00* (2006.01)
*G06F 11/10* (2006.01)
(Continued)

(52) U.S. Cl.
CPC .......... *G06F 11/1064* (2013.01); *G06F 3/064* (2013.01); *G06F 3/0619* (2013.01);
(Continued)

(58) Field of Classification Search
CPC ............ G06F 12/0811; G06F 12/0893; G06F 11/1064; G06F 12/16; G06F 3/0679;
(Continued)

(56) References Cited

U.S. PATENT DOCUMENTS 7,117,421 B1 * 10/2006 Danilak .............. G06F 11/1008
714/763
7,689,869 B2 * 3/2010 Terashita ............ G06F 11/1076
714/42

(Continued)

FOREIGN PATENT DOCUMENTS

JP    2011-257966    12/2001
JP    2012-94132    5/2012

(Continued)

OTHER PUBLICATIONS

International Preliminary Report on Patentability dated Sep. 29, 2016, issued by The Interational Bureau of WIPO in International Application No. PCT/JP2015/058069, 2 pages.

(Continued)

*Primary Examiner* — Guerrier Merant
(74) *Attorney, Agent, or Firm* — Finnegan, Henderson, Farabow, Garrett & Dunner, L.L.P.

(57) ABSTRACT

A cache memory includes cache memory circuitry that is accessible per cache line and a redundant-code storage that stores one or more numbers of first redundant codes to be used for error correction of cache line data stored in the cache memory circuitry per cache line and one or more numbers of second redundant codes to be used for error detection of a part of the cache line data.

19 Claims, 5 Drawing Sheets

(51) Int. Cl.
| | |
|---|---|
| *G06F 12/16* | (2006.01) |
| *G06F 12/0811* | (2016.01) |
| *G06F 12/0893* | (2016.01) |
| *G06F 3/06* | (2006.01) |
| *H03M 13/29* | (2006.01) |
| *G06F 12/123* | (2016.01) |

(52) U.S. Cl.
CPC ........ *G06F 3/0679* (2013.01); *G06F 12/0811* (2013.01); *G06F 12/0893* (2013.01); *G06F 12/16* (2013.01); *H03M 13/2906* (2013.01); *G06F 12/123* (2013.01); *G06F 2212/1008* (2013.01); *G06F 2212/1024* (2013.01); *G06F 2212/1032* (2013.01); *G06F 2212/283* (2013.01)

(58) Field of Classification Search
CPC ...... G06F 3/064; G06F 3/0619; G06F 12/123; G06F 2212/1024; G06F 2212/1008; G06F 2212/283; G06F 2212/1032; G06F 9/30152; G06F 9/3802; G06F 9/382; G06F 11/1012; H03M 13/2906
See application file for complete search history.

(56) References Cited

U.S. PATENT DOCUMENTS

| | | | | |
|---|---|---|---|---|
| 9,391,637 B2* | 7/2016 | Agrawal | ............. | G06F 11/1064 |
| 9,898,365 B2* | 2/2018 | Muralimanohar | .. | G06F 11/1076 |
| 2002/0199151 A1* | 12/2002 | Zuraski, Jr. | ......... | G06F 9/30152 |
| | | | | 714/763 |
| 2006/0031708 A1* | 2/2006 | Desai | ................. | G06F 11/1064 |
| | | | | 714/5.1 |
| 2008/0235485 A1* | 9/2008 | Haertel | ............... | G06F 11/1044 |
| | | | | 711/203 |
| 2009/0031188 A1* | 1/2009 | Miura | ................. | G06F 11/1064 |
| | | | | 714/755 |
| 2011/0231724 A1* | 9/2011 | Hara | .................. | G06F 11/1068 |
| | | | | 714/746 |
| 2011/0289380 A1 | 11/2011 | Wilkerson | | |
| 2012/0192035 A1 | 7/2012 | Nakanishi | | |
| 2012/0233498 A1 | 9/2012 | Ramaraju et al. | | |
| 2012/0254686 A1 | 10/2012 | Esumi et al. | | |
| 2013/0268795 A1 | 10/2013 | Nomura et al. | | |
| 2014/0195876 A1 | 7/2014 | Nachimuthu et al. | | |
| 2015/0082122 A1 | 3/2015 | Udipi et al. | | |

FOREIGN PATENT DOCUMENTS

| | | |
|---|---|---|
| JP | 2012-155430 | 8/2012 |
| JP | 2012-531683 | 12/2012 |
| JP | 2013-218403 | 10/2013 |

OTHER PUBLICATIONS

Written Opinion dated May 12, 2015, issued by Japanese Patent Office in International Application No. PCT/JP2015/058069;6 pages.
Seongwoo Kim et al., "Area Efficient Architectures for Information Integrity in Cache Memories", *ISCA*, 1999. 11 pages.
Wei Zhang et al., "ICR: In-Cache Replication for Enhancing Data Cache Reliability", *DSN*, 2003. 10 pages.
Alaa R. Alameldeen et al., "Energy Efficient Cache Design Using Variable-Strength Error-Correcting Codes", *ISCA*, 2011. 11 pages.
International Search Report dated May 12, 2015 from the Japanese Patent Office in International Application No. PCT/JP2015/058069 2 pages.

* cited by examiner

US 10,120,750 B2

CACHE MEMORY, ERROR CORRECTION CIRCUITRY, AND PROCESSOR SYSTEM

CROSS REFERENCE TO RELATED APPLICATIONS

This application is based upon and claims the benefit of priority from the prior Japanese Patent Application No. 2014-55343, filed on Mar. 18, 2014, the entire contents of which are incorporated herein by reference.

FIELD

Embodiments relate to a cache memory, an error correction circuitry, and a processor system.

BACKGROUND

As referred to as a memory wall problem, memory access is a bottleneck in performance and power consumption of processor cores. As a measure against the memory wall problem, there is a tendency for cache memories to have a larger capacity, along with which there is a problem of increase in leakage current of the cache memories.

MRAMs that attract attention as a candidate for a large-capacity cache memory are a non-volatile memory, having a feature of much smaller leakage current than SRAMs currently used in cache memories.

However, the MRAMs have a problem of a higher frequency of occurrence of bit errors than the SRAMs. Therefore, the MRAMs require an ECC (Error Check and Correction) circuitry. An error correction process by the ECC circuitry and memory access have to be performed one after another, which causes increase in latency of memory access.

The ECC circuitry generates a redundant code for each of cache lines of a cache memory which is accessed per cache line. Therefore, as the bit length of each cache line becomes longer, the time required for error correction becomes longer.

DETAILED DESCRIPTION

According to the present embodiment, there is provided a cache memory has cache memory circuitry that is accessible per cache line, and a redundant-code storage that stores one or more numbers of first redundant codes to be used for error correction of cache line data stored in the cache memory circuitry per cache line and one or more numbers of second redundant codes to be used for error detection of a part of the cache line data.

Hereinafter, embodiments will be explained with reference to the drawings. The following embodiments will be explained mainly with unique configurations and operations of a cache memory and an error correction circuitry. However, the cache memory and the error correction circuitry may have other configurations and operations which will not be described below. These omitted configurations and operations may also be included in the scope of the embodiments.

Figure 1:
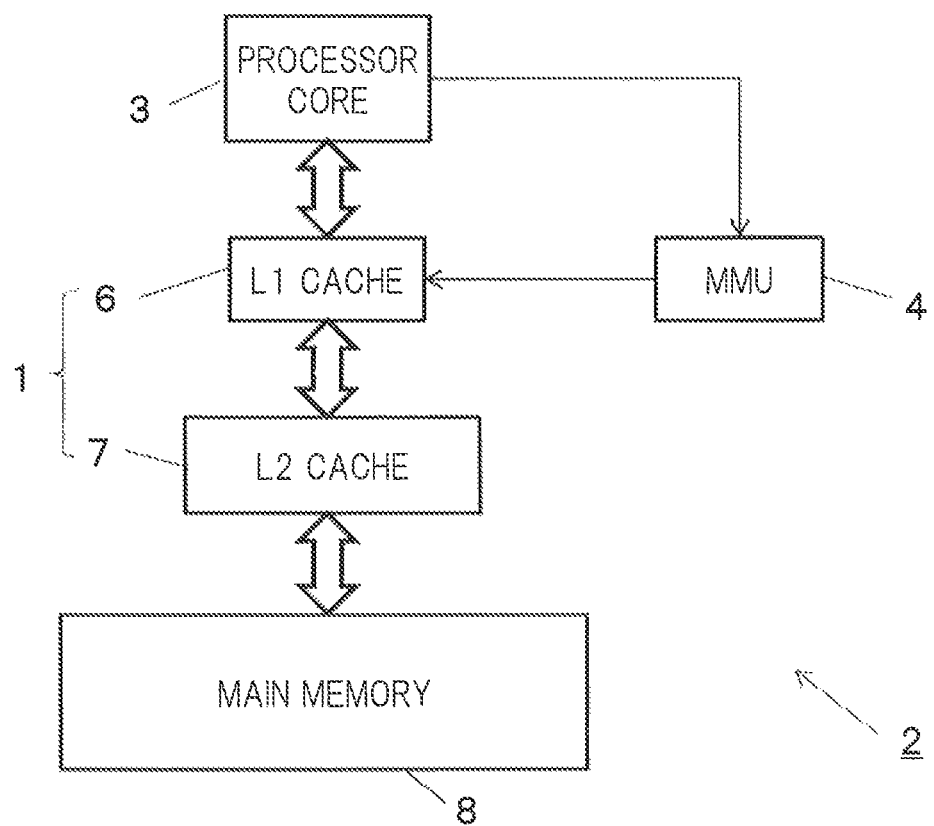
FIG. 1 is a block diagram schematically showing the configuration of a processor system 2 having a built-in memory 1 according to an embodiment.

FIG. 1 is a block diagram schematically showing the configuration of a processor system 2 having a built-in cache memory 1 according to an embodiment. The processor system 2 of FIG. 1 is provided with the cache memory 1, a processor core 3, and an MMU 4. The cache memory 1 has a layered structure of, for example, an L1-cache 6 and an L2-cache 7.

The MMU 4 converts a virtual address issued by the processor core 3 into a physical address. The converted physical address is used for accessing the main memory 8 and the cache memory 1. When data stored in the main memory 8 is changed, the MMU 5 updates a conversion table of virtual addresses and physical addresses.

The cache memory 1 of FIG. 1 stores at least a part of data stored in or of data to be stored in the main memory 8. The cache memory 1 includes the L1-cache 6 and cache memories 7 of a level L2 and higher.

Figure 2:
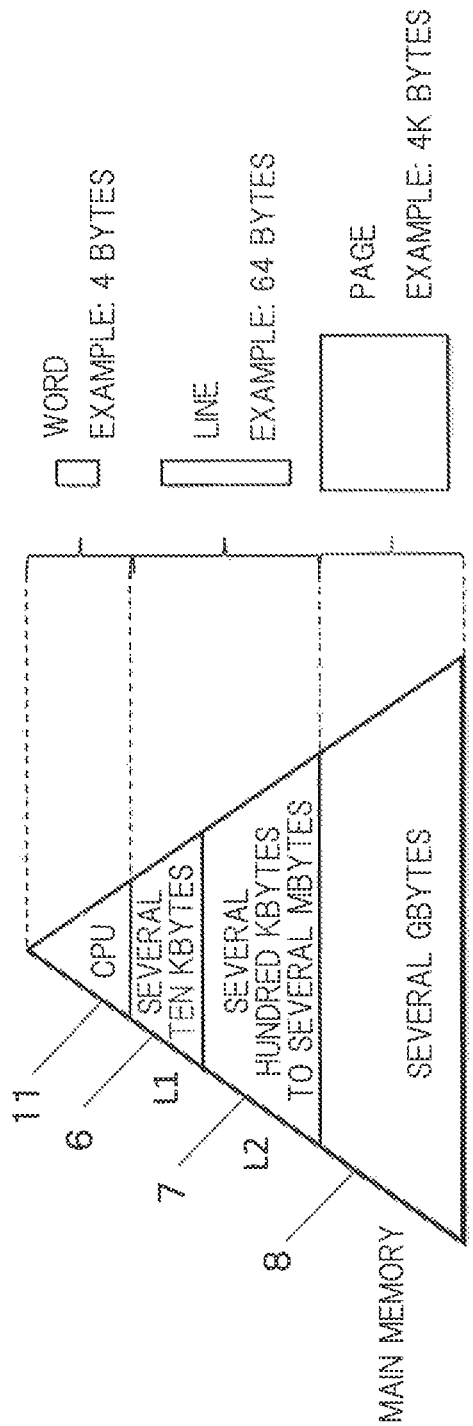
FIG. 2 is a diagram showing a memory layered structure in the present embodiment.

FIG. 2 is a diagram showing a memory layered structure in the present embodiment. As shown, the L1-cache 6 is positioned on the upper-most layer, followed by the L2-cache 7 on the next layer and the main memory 8 on the lower-most layer. When the processor core (CPU) 3 issues an address, the L1-cache 6 is accessed at first. When there is no hit in the L1-cache 6, the L2-cache 7 is accessed next. When there is no hit in the L2-cache 7, the main memory 8 is accessed. As described above, a higher-level cache memory 1 of an L3-cache or more may be provided, however, what is explained as an example in the present embodiment is the cache memory 1 of the L1-cache 6 and the L2-cache 7 in two layers.

The L1-cache 6 has a memory capacity of, for example, several ten kbytes. The L2-cache 7 has a memory capacity of, for example, several hundred kbytes to several Mbytes. The main memory 8 has a memory capacity of, for example, several Gbytes. The processor core 3 accesses the L1- and L2-caches 6 and 7 usually per cache line and the main memory 8 per page. A cache line has, for example, 64 bytes. One page has, for example, 4 kbytes. The number of bytes for the cache line and the page is arbitrary.

There is a variety of variations in data allocation policy to the layered cache memory 1. For example, in an inclusion type, data stored in the L1-cache 6 are usually also stored in the L2-cache 7. Data stored in the L2-cache 7 are usually also stored in the main memory 8.

Another data allocation policy is an exclusion type. In this type, no identical data are allocated to the L1-cache 6 and the L2-cache 7. Still, another data allocation policy is, for example, a hybrid of the inclusion type and the exclusion type. In this mode, for example, there are duplicate data to be stored in both of the L1-cache 6 and the L2-cache 7, and data to be exclusively stored in the L1-cache 6 or the L2-cache 7.

These modes are a data allocation policy between two caches. There is a variety of combinations of modes for a multi-layered cache. For example, the inclusion type may be used for all layers. For example, one option of the combination is the exclusion type between the L1- and L2-caches 6 and 7, and the inclusion type between the L2-cache 7 and a lower layer cache.

Figure 3:
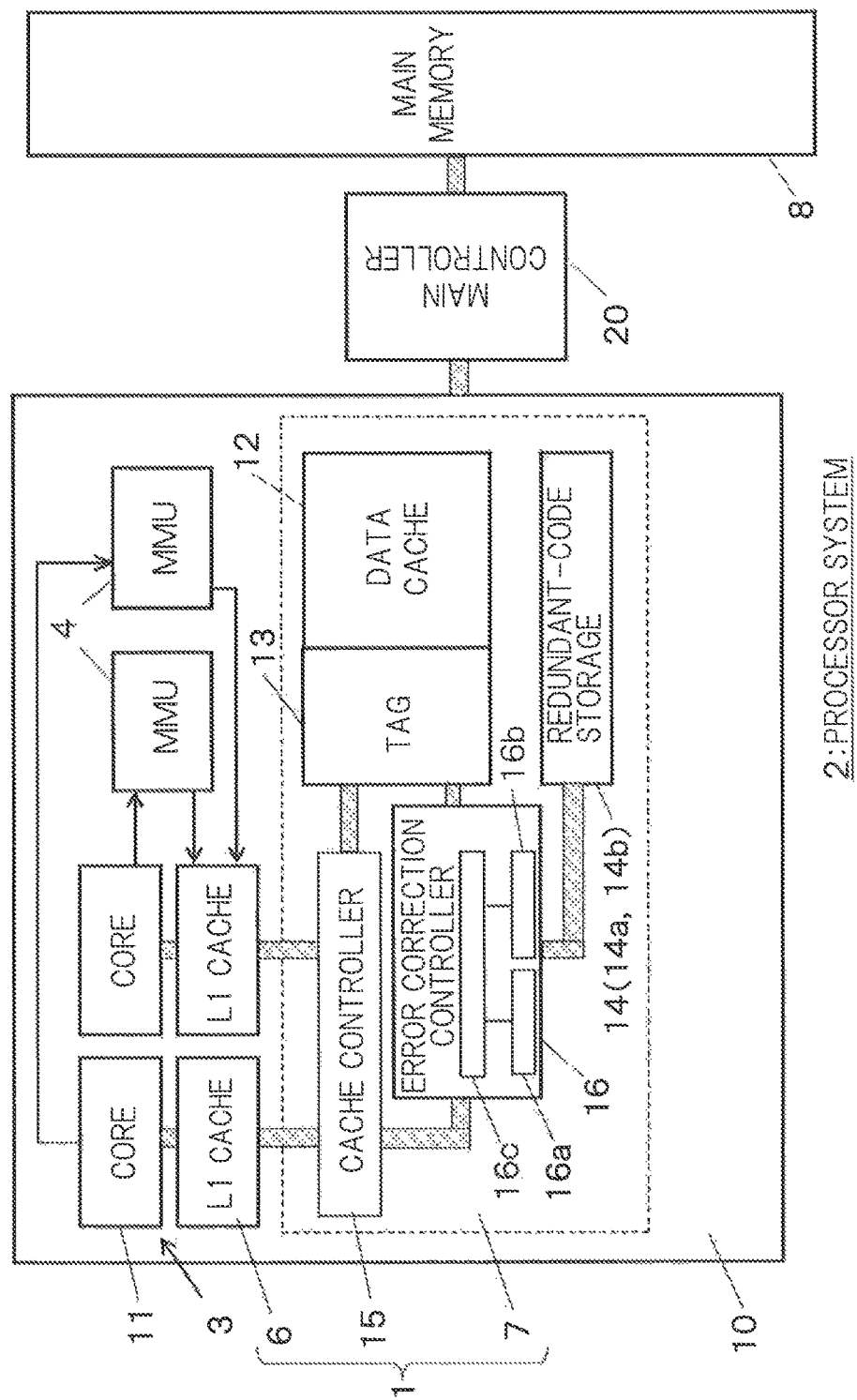
FIG. 3 is a block diagram of a detailed internal configuration of the cache memory 1 of FIG. 1.

FIG. 3 is a block diagram of a detailed internal configuration of the cache memory 1 of FIG. 1. The processor core 3 has, for example, a multicore configuration with a plurality of cores 11. The L1-cache 6 is connected to each core 11. Since the L1-cache 6 is required to have a high-speed performance, it has an SRAM (Static Random Access Memory), for example. The processor core 3 may have a single-core configuration with one L1-cache 6.

In FIG. 3, the cache memory 1, the processor core 3, and the MMUs 4 form a cache memory system 10. The cache memory system 10 performs data communication with the main memory 8 via a main memory controller 20. Each MMU 4 is usually provided per core 11. The MMUs 4 may be omitted.

The L2-cache 7 of FIG. 3 has a data cache 12, a tag 13, a redundant-code storage unit 14, a cache controller 15, and an error correction controller 16.

The data cache 12 stores cache line data that are accessible per cache line. The tag 13 stores address information on each cache line data.

The redundant-code storage unit 14 has a first storage unit 14a which stores a first redundant code for error correction of each cache line data stored in the data cache 12 and a second storage unit 14b which stores a second redundant code for error correction of data which is a part of each cache line data. The first and second redundant codes may be any kinds of codes.

As for the redundant code for error correction, for example, there are Hamming codes, BCH codes and RS codes. For example, the BCH codes may be used for the first and second redundant codes. For example, the Hamming codes and the BCH codes may be used for the first redundant code and the second redundant code, respectively.

Data for which the second redundant code is generated is, for example, important data, or critical data, in a cache line. The processor core 3 accesses the L2-cache 7 per cache line data. Data to be required by the processor core 3 is mostly data which is a part of cache line data. Therefore, in the present embodiment, concerning the critical data which is important for the processor core 3, the second redundant code is generated and stored in the redundant-code storage unit 14. When the critical data is read by the processor core 3, an error correction of the critical data is performed with the second redundant code and then the corrected data is quickly transferred to the processor core 3, without waiting for error correction of the entire cache line data with the first redundant code.

The critical data is any unit of data to be used by an arithmetic unit, or the core 11, in an arithmetic operation. The critical data is, for example, word data which has, for example, 32 bits and 64 bits for a 32-bit arithmetic unit and a 64-bit arithmetic unit, respectively.

The first redundant code is provided for each cache line data. Therefore, cache line data corresponding to each first redundant code can be identified by making a one-to-one correspondence between a redundant-code storing entry in the redundant-code storage unit 14 and each cache line. The second redundant code corresponds to a part (critical data) of cache line data. Therefore, it may not be so easy to identify which data each second redundant code corresponds to. It is thus preferable to provide the redundant-code storage unit 14 with word identification information of word that corresponds to each second redundant code. The word identification information storing method can be classified into a dynamic approach and a static approach.

An identification information storing method by the dynamic approach is, for example, a method for storing address information with which critical data is identifiable. It is supposed that cache line data has 64 bytes with a data length of 8 bytes, which corresponds to the second redundant code. There may be eight kinds of data which corresponds to the second redundant code in a cache line. At least 3-bit address information is thus required. In other words, a word identification area for storing the word identification information is required.

Another identification information storing method by the dynamic approach is, for example, a method for setting a 1-bit flag that indicates whether data stored in a line is critical data. In the above example, eight bits are required to store cache line information. A feasible method is, for example, a method for making correspondence between data that form a line and bits, in an address order, in such a way that the first bit is assigned to the first data, the second bit to the second data, • • •, and the eighth bit to the eighth data. Also in this method, a word identification area for storing the word identification information is required.

An identification information storing method by the static approach is, for example, a method for deciding data to be critical data in advance, with no provision of a memory area for storing identification information. It can be determined for which data the second redundant code is stored in the redundant-code storage unit 14, for example, by deciding the head data of a line as critical data, with no necessity of storing the identification information. Accordingly, in this method, a word identification area for storing the word identification information is not required.

For access information to the L2-cache 7, there are two cases in which an address is given. In one case, an address to be given is a complete physical address with which a line and also words that form the line are identifiable. In the other case, an address to be given is an address rounded so that each line is identifiable. When the complete physical address is given, the dynamic approach can be taken. However, when the rounded address is used, the dynamic approach cannot be taken. When the rounded address is given, for example, the static approach is taken. The word identification area can take any form as long as the word identification area corresponds to each cache line data logically or physically. In this embodiment, the word identification area is present in the tag 13 for simplicity.

The data cache 12 is, for example, a non-volatile memory. A non-volatile memory usable as the data cache 12 is, for example, an MRAM (Magnetoresistive RAM) for which practically there is no limitation on the number of times of rewriting. For example, an SRAM or DRAM may be used.

The tag 13 is, for example, a volatile memory. A volatile memory usable as the tag 13 is, for example, an SRAM (Static RAM) that operates at a higher speed than the MRAM. For example, an MRAM or DRAM may be used.

The redundant-code storage unit 14 described above may be a non-volatile memory or a volatile memory, with a variety of selection criteria. For example, a choice between the MRAM and SRAM is considered. In general, the SRAM has a higher access speed than the MRAM. Therefore, when the redundant-code storage unit 14 is required to have a higher access speed, the SRAM may be used as the redundant-code storage unit 14. Moreover, in general, the SRAM has a lower data-error occurrence probability than the MRAM. Therefore, when the redundant-code storage unit 14 is required to have a higher reliability, the SRAM may be used as the redundant-code storage unit 14. Furthermore, the MRAM is easier to be configured to have a larger capacity than the SRAM. Therefore, when it is not desirable to have a larger capacity with the SRAM, the MRAM may be used as the redundant-code storage unit 14. For example, the MRAM has a smaller leakage power than the SRAM.

Therefore, when it is not desirable to increase leakage power, the MRAM is used as the redundant-code storage unit 14.

Each entry of the redundant-code storage unit 14 has a one-to-one correspondence with each entry of the tag 13. In order to assure the reliability of redundant codes stored in the redundant-code storage unit 14, it is preferable to use a memory of lower frequency of errors such as the SRAM for the redundant-code storage unit 14. For example, when the SRAM is used for the tag 13, the redundant-code storage unit 14 may be provided within the tag 13. The redundant-code storage unit 14 may, however, be provided as part of the data cache 12. Or the redundant-code storage unit 14 may be provided separately from the data cache 12 and the tag 13.

The cache controller 15 determines whether data corresponding to an address issued by the processor core 3 is stored in the data cache 12. In detail, the cache controller 15 performs hit/miss determination on whether the address issued by the processor core 3 matches address information stored in the tag 13 to control data write to and data read from the L2-cache 7, and write-back to the main memory 8.

The error correction controller (error correction circuitry) 16 has, as shown in FIG. 3, a first error correction unit (error correction unit) 16a, a second error correction unit (error detection unit) 16b, and a data transfer control unit 16c. The first error correction unit 16a performs error correction per cache line based on the first redundant code that corresponds to each cache line data stored per cache line in the data cache 12. The second error correction unit 16b performs error correction of data which is a part of each cache line data based on the second redundant code that corresponds to the data to be corrected. The data transfer control unit 16c transfers the data error-corrected by the second error correction unit 16b to the processor core 3 before the completion of error correction by the first error correction unit 16a.

In more specifically, when storing new cache line data to the L2-cache 7, the error correction controller 16 generates a first redundant code for error correction of the cache line data and stores the first redundant code in the redundant-code storage unit 14. When cache line data is read out from the data cache 12 in accordance with a read request from the processor core 3, the error correction controller 16 reads a first redundant code that corresponds to the cache line data, performs error correction of the cache line data, and transfers the error-corrected cache line data to a read requester.

Moreover, when storing new cache line data to the L2-cache 7, the error correction controller 16 can generate a second redundant code for error correction of specific data in the cache line data to store the second redundant code in the redundant-code storage unit 14. In designation of specific data, the error correction controller 16 may automatically acquire data of a predetermined length starting from a predetermined bit position in cache line data. Or the specific data may be dynamically determined based on access information under program in running. When data, for which a second redundant code has been generated, is included in cache line data in accordance with a read request from the processor core 3, the error correction controller 16 performs error correction of the data with the second redundant code and transfers the error-corrected data to a read requester.

The read requester is this example is the L1-cache 6. When data in accordance with a read request from the processor core 3 is included in data sent from the L2-cache 7, the L1-cache 6 transfers the requested data to the processor core 3. The redundant codes can be generated, not only when data are stored, but also at any timing, for example, at regular intervals.

As described above, when there is a read request from the processor core 3, the error correction controller 16 performs error correction of cache line data corresponding to the first redundant code and of data corresponding to the second redundant code in parallel or one after another.

Data corresponding to the second redundant code has a shorter bit length than cache line data. It is then supposed that error correction of the data corresponding to the second redundant code and error correction of the cache line data are performed in parallel. In this case, it is highly likely that the error correction of the data corresponding to the second redundant code is complete for a shorter period than the error correction of the cache line data corresponding to the first redundant code. When the error correction of the data corresponding to the second redundant code is complete, even if the error correction of the cache line data corresponding to the first redundant code is not complete, the error correction controller 16 firstly transfers the error-corrected data corresponding to the second redundant code to the processor core 3. Accordingly, the processor core 3 can acquire important data quickly, thus enhancing access efficiency to the L2-cache 7.

Data corresponding to the second redundant code can have any bit length with no particular limitation as long as the data has a shorter bit length than cache line data. Nevertheless, the bit length of data corresponding to the second redundant code is preferably 8×n (n being an integer of 1 or more) bytes. This is because the processor core 3 performs data access per 8-byte word data.

In the embodiment of FIG. 1, it is the L2-cache 7 to store the first and second redundant codes. However, the present embodiment is not limited to the L2-cache 7. It may be the L1-cache 6 or a higher-level cache memory such as an L3-cache (not shown) to store the first and second redundant codes. For example, when n-layer, where n is an integer of 2 or more, cache memories are provided, a non-volatile memory such as an MRAM may be used for at least the highest layer cache memory to store the first and second redundant codes. In a more specific example, when L1- to L3-cache memories of three layers are provided, a non-volatile memory may be used for the L3-cache or the L2- and L3-caches to store the first and second redundant codes.

What is described in the present embodiment is an example of error correction with the first and second redundant codes. However, the present embodiment is not limited to this. For example, the first and second redundant codes are used for error detection only. Or, for example, the first redundant code is used for error correction and the second redundant code is used for error detection only. In this case, for example, if an error is detected with the second redundant code, the data transfer control unit 16c transfers line data error-corrected with the first redundant code, without transferring word data. In the case of error detection only, the first and second error correction units 16a and 16b of FIG. 1 may have an error detection function only.

The first and second error correction units 16a and 16b may be physically integrated into one component. In this case, error correction by the first error correction unit 16a and error correction by the second error correction unit 16b may be performed one after another.

(Configuration of L2-Cache 7)

Figure 4:
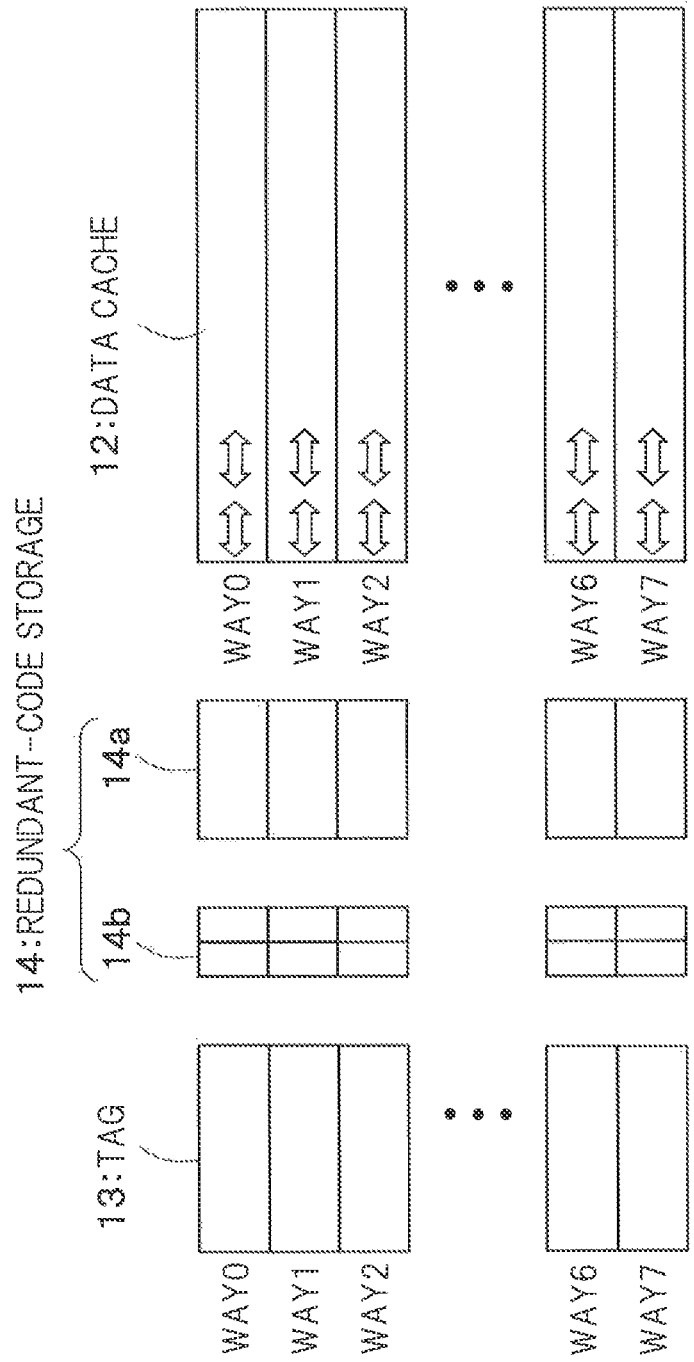
FIG. 4 is a diagram illustrating the configuration of a L2-cache 7 in the present embodiment.

FIG. 4 is a diagram illustrating the configuration of the L2-cache 7 in the present embodiment. As shown in FIG. 4, the data cache 12 in the L2-cache 7 is divided into a plurality of ways 0 to 7, each of which is accessed per cache line. The number of ways is not limited to eight. Moreover, the data cache 12 may not have to be divided into a plurality of ways.

In the redundant-code storage unit 14, the first storage unit 14a stores first redundant codes per way and the second storage unit 14b stores at least one second redundant code per way. In the example of FIG. 4, the number of second redundant codes stored is the same for all of the ways. For example, two second redundant codes corresponding two word data are stored in the redundant-code storage unit 14 for each way. Any number of second redundant codes can be stored in the redundant-code storage unit 14.

The second redundant code can be generated with respect to any two word data among the cache line data of each way. For example, the second redundant code may be generated based on information statically determined, such as two word data from the head of each cache line data. Or the two word data may be dynamically determined based on information under program in running. A method of designating such critical data will be explained in detail later.

In the embodiment of FIG. 4, all of the ways are treated equally. However, latency cannot be shortened with the second redundant codes when all data in a line are not treated as critical word and when data other than the critical word are accessed by the processor core 3. In order to shorten the latency, there is a method for storing second redundant codes by treating as many data as possible among line data, as the critical data. However, in view of cost and power consumption, it is more desirable to have fewer memory resources for storing the second redundant codes.

In addition to, as shown in FIG. 4, an idea of arranging memory resources for storing the second redundant codes equally in all of the ways, there is an idea of priority arrangement to arrange memory resources for storing the second redundant codes in important ways.

Figure 5:
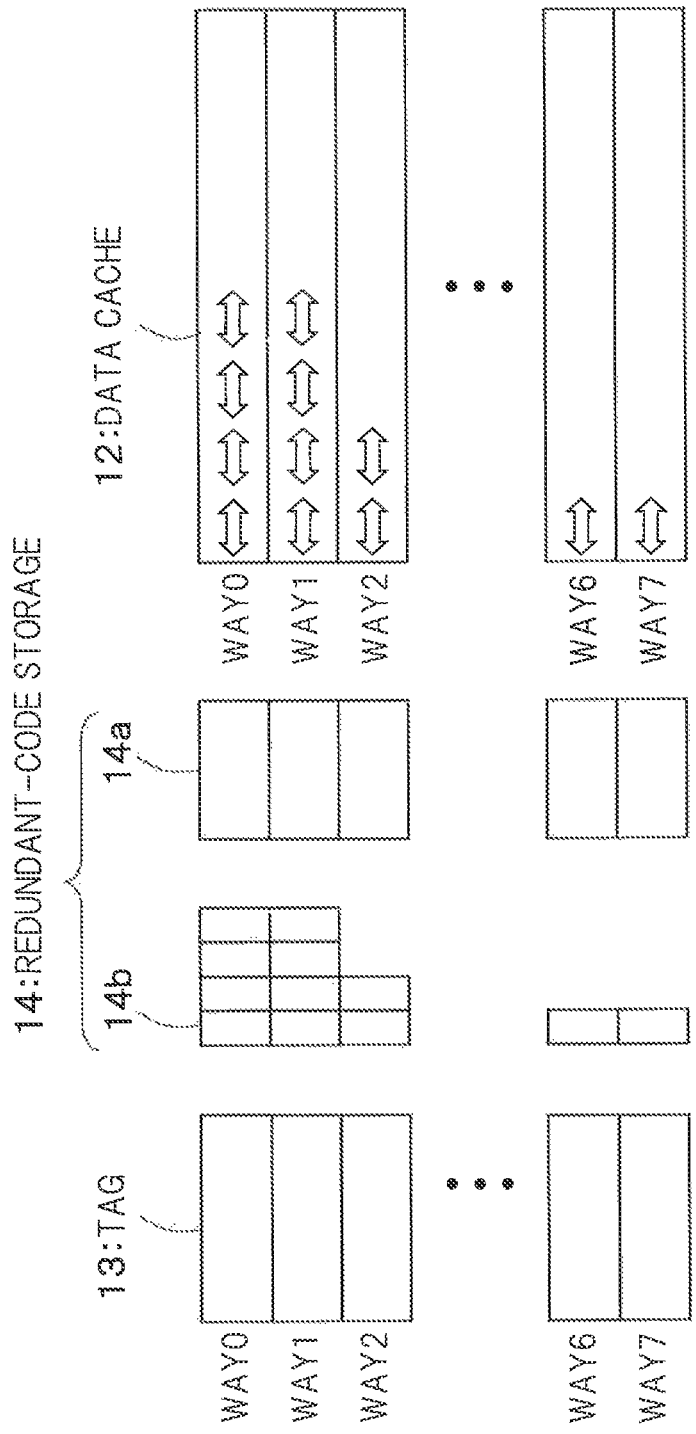
FIG. 5 is a diagram showing an example in which there are different numbers of second redundant codes storable in ways.

As an example of criteria for the priority arrangement, the use of line temporal locality is shown in FIG. 5. The line temporal locality generally indicates the characteristics of ways, that is, the smaller the way number, the more often the way being accessed by the processor core 3. FIG. 5 shows an example in which the number of storable second redundant codes is different among the ways. In the example of FIG. 5, for each of ways 0 and 1, four second redundant codes are storable. For each of ways 2 to 5, two second redundant codes are storable. For each of ways 6 and 7, one second redundant code is storable. The number of redundant codes storable in each way can be freely changed. In the case of FIG. 5, the number of second redundant codes is maximum for the way 1 and minimum for the way 7.

In the above example, the number of storable second redundant codes is different among the ways, which is a mode of storing the second redundant codes in view of temporal locality. However, the criterion for storing a different number of second redundant codes is not limited to this. For example, a frequency of occurrence of errors, which indicates in which line, data tend to have errors, may be used as criteria.

(Critical Word Designation Method)

As a common matter for the entire configuration of the present embodiment, there is a critical word designation method. For example, the second redundant codes are generated in order of data being accessed first in a cache line in descending order. For example, there are three methods as described below as the critical word designation method.

1) Use the characteristics that an address closer to the head of a cache line is more often accessed by the processor core 3. Based on the characteristics, the second redundant codes are generated for a predetermined number of word data from the head address in the cache line. In this method, critical words are selectable without acquiring dynamic information.

2) Use the temporal locality per word data. As described above, according to the temporal locality, for example, it can be determined that the access frequency is higher for data accessed by the processor core 3 more recently. Based on the characteristics, the second redundant codes may be generated for word data in order of being more recently accessed by the processor core 3 in descending order. This may be done per line or for part of a cache such as a bank or for the entire cache. The hardware that achieves this processing may perform LRU control, for example, per line or for part of a cache such as a bank or for the entire cache.

3) Use the characteristics that word data that has been more often accessed by the processor core 3 tends to be accessed more often. Based on the characteristics, the number of access times is measured for each word data to generate the second redundant codes for word data in order of being accessed more often in descending order.

The above methods 1) to 3) may be combined. For example, it is supposed that two second redundant codes can be stored per line. One option of the combination is using one second redundant code for the head word in a cache line by the method 1) and using the other second redundant code for a word designated the method 3). In this option, it may happen that a word selected by the method 1) and a word selected by the method 3) are the same word. In this case, the identical second redundant codes may be stored or one of the second redundant codes may be selected again under new policy.

(Read Process)

As a common matter for the entire configuration using the present embodiment, data reading from the L2-cache 7 will be explained. What will be explained below is, for simplicity, an example in which the cache controller 15 has received, from a read requester, address information with which word data is uniquely identifiable. When the cache controller 15 receives, from the read requester, address information with which a line address is uniquely identifiable, as described above, the cache controller 15 has information uniquely identifiable a word having the second redundant code. Therefore, when the cache controller 15 receives a line address, the identification of word data having the second redundant code by accessing from the tag 13 may be omitted from the following process.

There are two processes that the processor core 3 makes a read request to the L2-cache 7. One process is a parallel access option for accessing the tag 13 and the data cache 12 in parallel. The other process is a sequential access option for accessing the tag 13 and the data cache 12 sequentially. In addition to the two options, the present embodiment has another option of whether to access the first and second redundant codes at the time of accessing the tag 13 or the data cache 12. For example, the cache controller 15 reads data through the following process.

1) Access is made in parallel to the tag 13, the data cache 12, and the redundant-code storage unit 14. If there is a cache hit by accessing the tag 13, error correction with the first redundant code and error correction with the second redundant code are made in parallel. Data are transferred to the read requester in order of completion of error correction.

2) Access is made to the tag 13 and the redundant-code storage unit 14, with cache hit/miss determination and the first and second redundant codes reading. If there is a cache hit, access is made to the data cache 12 to perform error correction with the first redundant code and error correction with the second redundant code in parallel. Data are transferred to the read requester in order of completion of error correction.

3) Access is made to the tag 13 to perform cache hit/miss determination. If there is a cache hit, access is made to the data cache 12 and the redundant-code storage unit 14 to perform error correction with the first redundant code and error correction with the second redundant code are made in parallel. Data are transferred to the read requester in order of completion of error correction.

What is described in the above read process is an example in which, even in the case of transferring word data error-corrected with the second redundant code, error correction with the first redundant code and line data transfer are performed. Such a sequence may, however, not always necessarily be performed. For example, if it is found that the read requester requests for word data having the second redundant code by referring to the tag 13, the read-out of the word data and the error correction using the second redundant code may be performed. In this case, access to the entire line data and error correction using the first redundant code may be omitted.

(Write Process)

Data write to the L2-cache 7 will be explained next. Like the read process, what will be explained below is an example in which the cache controller 15 has received, from a read requester, address information with which word data is uniquely identifiable.

In the case where the first redundant code per cache line are only stored, but the second redundant codes is not stored, in data write control at the time of cache miss, new first redundant code may be generated simultaneously with cache line data writing. In data write control at the time of cache miss in storing the first and second redundant codes, the second redundant code has to be generated in parallel or sequentially with the generation of new first redundant code.

Concerning data writing in a cache-hit cache line, not only data writing to the entire cache line, but also data writing to a part of word data in the cache line may be performed. In this case, it is checked whether a second redundant code corresponding to word data to be newly written has been stored in the redundant-code storage unit 14. Only when the second redundant code has been stored in the redundant-code storage unit 14, a second redundant code is generated for the word data to be newly written to update the redundant-code storage unit 14. Otherwise, even in the case where data is written in the entire cache line, only words to be rewritten in the cache line may be designated to generate the above-described redundant codes.

In the case where the cache controller 15 receives only an address with which line data is uniquely identifiable from a write requester, the same process as that at the time of cache miss may be performed at the time of cache hit.

(Replacement Process)

Next, a process of LRU (Least Recently Used) replacement will be explained. The cache controller 15 manages data which have not been recently accessed, as LRU positions. It is supposed that, based on the LRU positions, word data are copied or moved between different ways. In this case, the LRU replacement can be performed only by updating tag information, as long as the number of word data to be copied or moved is the same for each way. In general, it is only enough to rewrite an LRU-order memory area associated with each entry. For example, in the case of FIG. 4, it is only enough to rewrite information such as way 0 and way 7 associated with the respective entries.

On the contrary, in FIG. 5, when the number of the stored second redundant codes is different for each way, a process of managing the different number of second redundant codes per way is required in addition to general control of the cache memory 1. The following are examples of simple method for the process.

1) When data is moved from a way which stores a smaller number of second redundant codes to a way which stores a larger number of second redundant codes, a specific number of word data, for which new second redundant codes are storable, are selected from a cache line according the critical word selection criteria. Then, second redundant codes for the selected word data are generated. Second redundant codes already stored and the second redundant codes generated in the above process are written in the redundant-code storage unit 14 that corresponds to the way to which the data is to be moved (for example, in the case of data move from way 7 to way 2 in FIG. 5).

2) When data is moved from a way which stores a larger number of second redundant codes to a way which stores a smaller number of second redundant codes, only the second redundant codes for word data of higher priority, among second redundant codes already stored for a plurality of word data, are copied or moved to the redundant-code storage unit 14 (for example, in the case of data move from way 2 to way 7 in FIG. 5).

The above methods, however, may cause the overhead of speed, power, etc. due to the frequent copying of the second redundant codes. In order to restrict the overhead, the second redundant codes may be updated for the difference between the numbers of word data for which the second redundant codes have been generated. In FIG. 5, when the number of second redundant codes is different for each way, it is supposed that the second redundant codes for two word data are allocated to the way 1 that has stored data A and the second redundant codes for one word data are allocated to the way 8 that has stored data B. In this case, for the LRU positional replacement between the ways 1 and 8, the following process can be performed.

Firstly, tag information is updated like a general cache memory 1. Then, a redundant code area for one word data of the data A is reallocated as a redundant code area for one word data of the data B. Next, redundant codes for one word data of the data B are generated and stored in the redundant code area for one word data newly allocated to the data B based on the critical-word selection criteria.

As described above, in the present embodiment, for a part of data among cache line data, the second redundant codes are generated in addition to the first redundant codes for the cache line data. The error correction for the part of data thus can be quickly performed. Therefore, for example, by generating the second redundant codes for important data among the cache line data, the result of error correction for the data can be quickly provided to the processor core 3 to enhance the processing speed of the processor core 3.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A cache memory comprising:
cache memory circuitry that is accessible per cache line; and a redundant-code storage that stores:
one or more numbers of first redundant codes to be used for error correction of cache line data stored in the cache memory circuitry per cache line, one or more numbers of second redundant codes to be used for error detection of critical data included in a part of the cache line data, and identification information to identify data corresponding to the second redundant codes, wherein the critical data comprises at least one of data corresponding to an address in a head side of the cache line, data accessed recently by a processor in the cache line, and a part of data selected in descending order of being more recently accessed by the processor core in the cache line.

2. The cache memory of claim 1, wherein the second redundant codes are used for error detection and correction of data having a length equal to integral multiple of a length of word data included in the corresponding cache line data.

3. The cache memory of claim 1, wherein the cache memory circuitry comprises:
a data cache that stores the cache line data; and
a tag that stores address information on the cache line data stored in the data cache, wherein the redundant-code storage is provided at a part of the data cache or the tag.

4. The cache memory of claim 1, wherein the cache memory circuitry comprises:
a data cache that stores the cache line data; and
a tag that stores address information on the cache line data stored in the data cache, wherein the redundant-code storage is provided at a part of the tag.

5. The cache memory of claim 3, wherein the data cache includes a non-volatile memory; and the tag includes a volatile memory.

6. The cache memory of claim 3, wherein the data cache includes an MRAM (Magnetoresistive RAM); and the tag includes an SRAM (Static RAM).

7. The cache memory of claim 3, wherein the data cache has a plurality of ways accessible per cache line, wherein the redundant-code storage stores, for a way, a same number of the second redundant codes.

8. The cache memory of claim 3, wherein the data cache has a plurality of ways accessible per cache line, wherein the redundant-code storage stores different numbers of the second redundant codes in at least two ways among the plurality of ways.

9. The cache memory of claim 8, wherein the redundant-code storage stores a more number of the second redundant codes for a way which is accessed at a higher frequency in the data cache.

10. The cache memory of claim 3, wherein the redundant-code storage stores at least the one second redundant code which corresponds to an address of data stored in the data cache, in descending order from most recently accessed data.

11. The cache memory of claim 3, wherein the redundant-code storage stores at least the one second redundant code which corresponds to a head side address in the cache line of the data cache.

12. The cache memory of claim 3, wherein the redundant-code storage stores by priority, the second redundant code corresponding to data accessed by a processor at a higher frequency among data stored in the data cache.

13. The cache memory of claim 1 further comprising a cache controller to control access to the cache memory and the redundant-code storage, wherein the cache controller controls so that the first and second redundant codes are stored in the redundant-code storage in parallel.

14. The cache memory of claim 1 further comprising a cache controller to control access to the cache memory and the redundant-code storage, wherein the cache controller controls so that the first and second redundant codes are stored in the redundant-code storage one after another.

15. The cache memory of claim 1 further comprising a cache controller to control access to the cache memory and the redundant-code storage, wherein, the cache controller updates the second redundant codes in the redundant-code storage if there is a change in the part of the cache line data when updating cache line data.

16. An error correction circuitry comprising:
error correction circuitry to perform error correction per cache line based on a first redundant code corresponding to cache line data stored in a cache memory per cache line; and error detection circuitry to perform error detection of the critical data based on a second redundant code corresponding to the critical data included in a part of the cache line data, wherein the critical data comprises at least one of data corresponding to an address in a head side of the cache line, data accessed recently by a processor in the cache line, and a part of data selected in descending order of being more recently accessed by the processor core in the cache line.

17. The error correction circuitry of claim 16 further comprising a data transfer controller to transfer data error-detected by the error detection circuitry to a processor core before completion of the error correction by the error correction circuitry.

18. A processor system comprising:
a processor core;
a first-level cache memory; and
a layered cache memory than the first-level cache memory,
wherein the layered cache memory comprises:
a data cache;
a tag that stores address information on data stored in the data cache; and
a redundant-code storage that stores a first redundant code used for error correction of cache line data stored in the data cache per cache line, a second redundant code to be used for error detection of critical data included in a part of the cache line data, and identification information to identify data corresponding to the second redundant codes,
wherein the critical data comprises at least one of data corresponding to an address in a head side of the cache line, data accessed recently by a processor in the cache line, and a part of data selected in descending order of being more recently accessed by the processor core in the cache line.

19. The processor system of claim 18 further comprising:
error correction circuitry to perform error correction per cache line based on the first redundant code;
error detection circuitry to perform error detection of the critical data based on the second redundant code corresponding to the critical data included in a part of the cache line data; and
a data transfer controller to transfer data error-detected by the error detection circuitry to the processor core before completion of the error correction by the error correction circuitry.

* * * * *